United States Patent
Matsuyama

(10) Patent No.: US 6,876,187 B2
(45) Date of Patent: Apr. 5, 2005

(54) METHOD AND APPARATUS FOR MEASURING PHOTOELECTRIC CONVERSION CHARACTERISTICS

(75) Inventor: Jinsho Matsuyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 09/892,704

(22) Filed: Jun. 28, 2001

(65) Prior Publication Data

US 2002/0014886 A1 Feb. 7, 2002

(30) Foreign Application Priority Data

Jul. 4, 2000 (JP) ........................................ 2000-202358

(51) Int. Cl.$^7$ .............................................. G01R 31/00
(52) U.S. Cl. ...................................... 324/96; 324/158.1
(58) Field of Search ........................... 324/96, 750–753, 324/767, 770; 250/214.1; 356/328, 215

(56) References Cited

U.S. PATENT DOCUMENTS

| | | | | |
|---|---|---|---|---|
| 4,049,963 A | * | 9/1977 | Kuehnle ................... | 250/214.1 |
| 4,730,158 A | * | 3/1988 | Kasai et al. ............... | 324/73.1 |
| 6,169,414 B1 | * | 1/2001 | Yoshino et al. ............ | 324/767 |
| 6,271,462 B1 | * | 8/2001 | Tsuzuki et al. ............. | 136/244 |
| 6,639,421 B1 | | 10/2003 | Yoshino et al. ............ | 324/767 |

FOREIGN PATENT DOCUMENTS

| | | |
|---|---|---|
| CN | 1204059 | 1/1999 |
| JP | 57 179674 | 5/1982 |

OTHER PUBLICATIONS

Troy Glatfelter, et al., "A Method For Determining The Conversion Efficiency Of Multiple–Cell Photovoltaic Devices", IEEE, pp. 1187–1193 (1987).

* cited by examiner

Primary Examiner—Kamand Cuneo
Assistant Examiner—Tung X. Nguyen
(74) Attorney, Agent, or Firm—Fitzpatrick, Cella, Harper & Scinto

(57) ABSTRACT

For the multi-source method suitable to measure the photoelectric conversion characteristics of a stacked solar cell, the light-receiving area of the solar cell to be measured is limited to the minimal area of laboratory level, and it is hard to measure a cell, module, or array having an area more than 400 cm$^2$. To cope with this problem, the irradiance of irradiation light is measured or adjusted, the current vs. voltage characteristic of a reference cell is measured, and the current vs. voltage characteristic of a sample cell is measured. Next, the current vs. voltage characteristic of the reference cell in standard test conditions is compared with the measurement result of the current vs. voltage characteristic of the reference cell, thereby obtaining a shift of the measurement result from the standard test condition on the basis of the shift of the irradiation light from the standard test condition. On the basis of the obtained shift of the measurement result, the measurement result of the current vs. voltage characteristic of the sample cell is corrected, and the photoelectric conversion characteristics of the sample cell are obtained.

17 Claims, 19 Drawing Sheets

FIG. 5

| | REFERENCE CELL | | SAMPLE CELL | |
|---|---|---|---|---|
| | IN STANDARD TEST CONDITIONS | IN MEASUREMENT | IN MEASUREMENT | AFTER CORRECTION |
| Pm.r.o(mW) | 9.4 | Pm.r*(mW) 10.0 | Pm.s*(mW) 11.3 | Pm.s.o(mW) 10.7 |
| Voc.r.o(V) | 2.04 | Voc.r*(V) 2.05 | Voc.s*(V) 2.1 | Voc.s.o(V) 2.1 |
| Isc.r.o(mA) | 6.9 | Isc.r*(mA) 6.9 | Isc.s*(mA) 7.2 | Isc.s.o(mA) 7.2 |
| FF.r.o | 0.67 | FF.r* 0.71 | FF.s* 0.75 | FF.s.o 0.71 |

FIG. 6

| | CURRENT OF SAMPLE CELL (Jsam) (mA/cm²) | CURRENT OF REFERENCE CELL (Jref) (mA/cm²) | CURRENT RATIO Jsam/Jref | MISMATCH COEFFICIENT |
|---|---|---|---|---|
| TOP CELL | 7.0 | 6.8 | 1.03 | 1.00 |
| MIDDLE CELL | 7.6 | 7.1 | 1.07 | 0.99 |
| BOTTOM CELL | 8.0 | 7.4 | 1.08 | 0.99 |

FIG. 7

| MEASUREMENT RESULT | |
|---|---|
| Pm (mW) | 10.7 |
| Voc (V) | 2.09 |
| Isc (mA) | 7.2 |
| FF | 0.71 |

FIG. 8

| SAMPLE CELL | | | |
|---|---|---|---|
| IN MEASUREMENT | | AFTER CORRECTION | |
| $\Delta Pm.s^*(\%)$ | 6.1 | $\Delta Pm.s.o(\%)$ | 0.2 |
| $\Delta Voc.s^*(\%)$ | 0.5 | $\Delta Voc.s.o(\%)$ | 0.5 |
| $\Delta Isc.s^*(\%)$ | 0.0 | $\Delta Isc.s.o(\%)$ | 0.0 |
| $\Delta FF.s^*$ | 5.6 | $\Delta FF.s.o$ | -0.3 |

F I G. 9

| REFERENCE CELL | | SAMPLE CELL | |
|---|---|---|---|
| IN STANDARD TEST CONDITIONS | IN MEASUREMENT | IN MEASUREMENT | AFTER CORRECTION |
| Pm.r.o(mW) 9.4 | Pm.r*(mW) 10.0 | Pm.s*(mW) 11.3 | Pm.s.o(mW) 10.6 |
| Voc.r.o(V) 2.04 | Voc.r*(V) 2.05 | Voc.s*(V) 2.1 | Voc.s.o(V) 2.09 |
| Isc.r.o(mA) 6.9 | Isc.r*(mA) 6.9 | Isc.s*(mA) 7.2 | Isc.s.o(mA) 7.2 |
| FF.r.o 0.67 | FF.r* 0.71 | FF.s* 0.75 | FF.s.o 0.71 |

FIG. 10

| SAMPLE CELL | | | |
|---|---|---|---|
| IN MEASUREMENT | | AFTER CORRECTION | |
| △Pm.s*(%) | 6.1 | △Pm.s.o(%) | -0.3 |
| △Voc.s*(%) | 0.5 | △Voc.s.o(%) | 0.0 |
| △Isc.s*(%) | 0.0 | △Isc.s.o(%) | 0.0 |
| △FF.s* | 5.6 | △FF.s.o | -0.3 |

FIG. 11

| REFERENCE SUBMODULE | | | SAMPLE SUBMODULE | |
|---|---|---|---|---|
| IN STANDARD TEST CONDITIONS | | IN MEASUREMENT | IN MEASUREMENT | AFTER CORRECTION |
| Pm.r.o(W) | 5.0 | Pm.r*(W) 4.7 | Pm.s*(W) 5.2 | Pm.s.o(W) 5.4 |
| Voc.r.o(V) | 1.4 | Voc.r*(V) 1.39 | Voc.s*(V) 1.42 | Voc.s.o(V) 1.42 |
| Isc.r.o(A) | 4.95 | Isc.r*(A) 4.95 | Isc.s*(A) 5.1 | Isc.s.o(A) 5.1 |
| FF.r.o | 0.72 | FF.r* 0.69 | FF.s* 0.72 | FF.s.o 0.75 |

FIG. 12

| SAMPLE CELL | | | |
|---|---|---|---|
| IN MEASUREMENT | | AFTER CORRECTION | |
| $\Delta Pm.s^*(\%)$ | -3.7 | $\Delta Pm.s.o(\%)$ | 0.5 |
| $\Delta Voc.s^*(\%)$ | -0.4 | $\Delta Voc.s.o(\%)$ | -0.4 |
| $\Delta Isc.s^*(\%)$ | 0.0 | $\Delta Isc.s.o(\%)$ | 0.0 |
| $\Delta FF.s^*(\%)$ | -3.4 | $\Delta FF.s.o(\%)$ | 0.8 |

F I G. 13

| REFERENCE MODULE | | | | SAMPLE MODULE | | |
|---|---|---|---|---|---|---|
| IN STANDARD TEST CONDITIONS | | IN MEASUREMENT | | IN MEASUREMENT | | AFTER CORRECTION | |
| Pm.r.o(W) | 1.5 | Pm.r*(W) | 1.5 | Pm.s*(W) | 73.7 | Pm.s.o(W) | 69.7 |
| Voc.r.o(V) | 1.48 | Voc.r*(V) | 1.48 | Voc.s*(V) | 22.5 | Voc.s.o(V) | 22.5 |
| Isc.r.o(A) | 1.4 | Isc.r*(A) | 1.4 | Isc.s*(A) | 4.2 | Isc.s.o(A) | 4.2 |
| FF.r.o | 0.7 | FF.r* | 0.74 | FF.s* | 0.78 | FF.s.o | 0.74 |

FIG. 14

| SAMPLE MODULE | | | |
|---|---|---|---|
| IN MEASUREMENT | | AFTER CORRECTION | |
| $\Delta Pm.s^*(\%)$ | 4.7 | $\Delta Pm.s.o(\%)$ | -1.0 |
| $\Delta Voc.s^*(\%)$ | -0.4 | $\Delta Voc.s.o(\%)$ | -0.4 |
| $\Delta Isc.s^*(\%)$ | 0.0 | $\Delta Isc.s.o(\%)$ | 0.0 |
| $\Delta FF.s^*(\%)$ | 5.1 | $\Delta FF.s.o(\%)$ | -0.6 |

FIG. 15

| REFERENCE MODULE | | IN MEASUREMENT | | SOLAR CELL ARRAY | | | |
|---|---|---|---|---|---|---|---|
| IN STANDARD TEST CONDITIONS | | | | IN MEASUREMENT | | AFTER CORRECTION | |
| Pm.r.o(W) | 6.4 | Pm.r*(W) | 6.8 | Pm.s*(kW) | 3.44 | Pm.s.o(kW) | 3.27 |
| Voc.r.o(V) | 2.04 | Voc.r*(V) | 2.05 | Voc.s*(V) | 202 | Voc.s.o(V) | 202 |
| Isc.r.o(A) | 5.45 | Isc.r*(A) | 5.45 | Isc.s*(A) | 27 | Isc.s.o(A) | 27 |
| FF.r.o | 0.58 | FF.r* | 0.61 | FF.s* | 0.63 | FF.s.o | 0.60 |

FIG. 16

| SOLAR CELL ARRAY | | | |
|---|---|---|---|
| IN MEASUREMENT | | AFTER CORRECTION | |
| $\Delta$Pm.s*(%) | 5.6 | $\Delta$Pm.s.o(%) | 0.4 |
| $\Delta$Voc.s*(%) | -0.2 | $\Delta$Voc.s.o(%) | -0.2 |
| $\Delta$Isc.s*(%) | 0.0 | $\Delta$Isc.s.o(%) | 0.0 |
| $\Delta$FF.s*(%) | 5.9 | $\Delta$FF.s.o(%) | 0.7 |

FIG. 17

| REFERENCE CELL | | | | SAMPLE PHOTOSENSOR | | | |
|---|---|---|---|---|---|---|---|
| IN STANDARD TEST CONDITIONS | | IN MEASUREMENT | | POWER CALIBRATION MEASUREMENT | | CURRENT CALIBRATION MEASUREMENT | |
| Pm.r.o(mW) | 16.6 | Pm.r*(mW) | 16.6 | Pm.s*(mW) | 17.0 | Pm.s*(mW) | 16.3 |
| Voc.r.o(V) | 2.00 | Voc.r*(V) | 1.99 | Voc.s*(V) | 2.01 | Voc.s*(V) | 2.01 |
| Isc.r.o(mA) | 11.5 | Isc.r*(mA) | 12.0 | Isc.s*(mA) | 12.5 | Isc.s*(mA) | 11.98 |
| FF.r.o | 0.72 | FF.r* | 0.69 | FF.s* | 0.68 | FF.s* | 0.68 |

FIG. 18

| SAMPLE PHOTOSENSOR | | | |
|---|---|---|---|
| OUTPUT CALIBRATION MEASUREMENT | | CURRENT CALIBRATION MEASUREMENT | |
| △Pm.s*(%) | 0.6 | △Pm.s.o(%) | -3.6 |
| △Voc.s*(%) | 0.0 | △Voc.s.o(%) | 0.0 |
| △Isc.s*(%) | 4.2 | △Isc.s.o(%) | -0.2 |
| △FF.s*(%) | -3.4 | △FF.s.o(%) | -3.4 |

METHOD AND APPARATUS FOR MEASURING PHOTOELECTRIC CONVERSION CHARACTERISTICS

FIELD OF THE INVENTION

The present invention relates to a method and apparatus for measuring photoelectric conversion characteristics and, more particularly, to a method and apparatus for measuring the photoelectric conversion characteristics of a photoelectric conversion device such as a solar cell, photodiode, photosensor, or electrophotographic photosensitive body and, especially, a stacked photoelectric conversion device.

BACKGROUND OF THE INVENTION

In a stacked photoelectric conversion device in which a plurality of photoelectric conversion elements with different spectral responses are stacked, long-wavelength light that cannot be completely absorbed by the upper photoelectric conversion element on the light incident side is absorbed by the lower photoelectric conversion element, thereby increasing the output or sensitivity. Hence, such stacked photoelectric conversion devices have been extensively developed.

It is very important to accurately measure the output characteristics of a stacked photoelectric conversion device due to the following reasons.

For example, in manufacturing and delivering stacked photoelectric conversion devices whose maximum power is important, a photoelectric conversion device whose maximum power is less than a rated value is determined as a defective product by inspection. However, the maximum power of a photoelectric conversion device to be delivered cannot be guaranteed unless the output characteristics can be accurately measured. In addition, if an output characteristics measurement error is large, and the measurement error changes depending on the state of the measuring apparatus, the inspection threshold value varies even for photoelectric conversion devices with the same quality, resulting in unstable manufacturing yield. Furthermore, if the inspection threshold value includes a measurement error value to guarantee the quality of photoelectric conversion devices to be delivered, the manufacturing yield inevitably decreases.

If the output of a stacked photoelectric conversion device cannot be accurately expected, no expected system characteristic can be obtained or the system efficiency degrades in building a system using the stacked photoelectric conversion device. When the stacked photoelectric conversion device is a solar cell, it considerably affects, e.g., the guaranteed maximum power of the solar cell, manufacturing yield, power generation expectation of a power generation system, and system efficiency.

However, it is very difficult to accurately measure the output characteristics of a stacked photoelectric conversion device. The main reason for this is that the output characteristics of the stacked photoelectric conversion device largely change depending on the spectrum of irradiation light. For example, a double-type solar cell (to be referred to as a "double cell" hereinafter) in which two semiconductor junctions are stacked and connected in series will be described in detail. The upper semiconductor junction on the light incident side is called a top cell, and the lower semiconductor junction is called a bottom cell. The short-circuit current of each cell changes depending on the spectrum of irradiation light because the cells have different spectral responses. As a result, the short-circuit current, fill factor, and open-circuit voltage of the entire double cell change, and the output characteristics of the double cell largely change.

To the contrary, in a single-layered cell (to be referred to as a "single cell" hereinafter) having a single semiconductor junction, only the short-circuit current changes depending on the spectrum of irradiation light, and the fill factor and open-circuit voltage are rarely affected. For this reason, when the spectrum dependence of the short-circuit current is corrected, the output characteristics can be almost accurately measured.

Generally, to accurately measure the output characteristics of a photoelectric conversion device, test conditions such as the intensity and spectrum of irradiation light and the temperature of the photoelectric conversion device must be defined. For, e.g., a solar cell, the test conditions are defined as standard test conditions as follows.

Temperature of solar cell: 25° C.

Spectrum of irradiation light: standard sunlight (The spectrum of standard sunlight is defined by JIS C 8911)

Irradiance of irradiation light: 1,000 W/m$^2$

However, of these standard test conditions, the spectrum of standard sunlight can hardly be obtained even when outdoor sunlight is used. This is because the standard sunlight is obtained only under limited meteorological conditions. It is impossible to obtain the spectrum of standard sunlight using a pseudo sunlight source indoors.

For a single cell, pseudo sunlight sources (solar simulators) are classified into ranks A, B, and C sequentially from one close to the standard sunlight on the basis of the spectrum, variation (to be referred to as a "positional variation" hereinafter) in irradiance depending on the position, and time variation ratio. This ranking is described by JIS C 8912 and JIS C 8933. Using a solar simulator of rank A or B and a secondary reference solar cell having a spectral response similar to that of a solar cell to be measured, the irradiance of the solar simulator is set, thereby correcting an error due to a shift in spectrum. This measuring method is described by JIS C 8913 and JIS C 8934.

The above measuring method is possible for a single cell for which the spectrum affects almost only the short-circuit current. However, in a stacked solar cell, the spectrum affects not only the short-circuit current but also the fill factor and open-circuit voltage, as described above, and the output characteristics cannot be accurately measured by the above measuring method. Hence, the stacked solar cell is excluded from the above-described JIS.

The following technique has been proposed as a method of accurately measuring the output characteristics of a stacked solar cell.

The spectrum of a solar simulator used to measure a stacked solar cell is made adjustable and adjusted to obtain short-circuit current and fill factor values that the stacked solar cell probably generates under standard sunlight, thereby accurately measuring the output characteristics (this technique will be referred to as a "multi-source method" hereinafter) (T. Glatfelter and J. Burdick, 19$^{th}$ IEEE Photovoltaic Specialists Conference, 1987, pp. 1187–1193).

That is, each of a plurality of semiconductor junctions of a stacked solar cell is defined as a component cell. Let In.ref (n is the number of each component cell) be the short-circuit current generated by each component cell in the stacked solar cell under standard sunlight and In.test be the short-circuit current generated under a solar simulator. Then, when the spectrum of the solar simulator is adjusted to satisfy $$\text{In.test} = \text{In.ref} \tag{1}$$

for each component cell, the short-circuit current and fill factor of the stacked solar cell match the values under the standard sunlight.

An assumption for the above measurement technique is use of a solar simulator having an adjustable spectrum. In the above-described reference, to adjust the short-circuit current of each component cell, light components from three light sources: one xenon (Xe) lamp and two halogen lamps are separated into three wavelength bands and then synthesized. By adjusting the irradiances of the three light sources, the intensities of light components in the three wavelength bands are controlled, thereby adjusting the spectrum of the synthesized light.

The solar simulator with variable spectrum is possible for a small irradiation area of 400 cm$^2$ or less. However, due to the following reasons, it is very difficult to manufacture a spectrum adjustable solar simulator having an area more than 400 cm$^2$.

(i) Since a plurality of light components having different spectra are synthesized, the positional variations in spectrum of the synthesized light and in irradiance become large. The larger the irradiation area is, the more serious these variations become.
  (ii) Since the spectrum of partial light from the light source is used, the light intensity tends to be low. When the irradiation area becomes large, it is hard to obtain a irradiance of the standard test condition of 1,000 W/m$^2$.
  (iii) The structure becomes complex, and the manufacturing cost largely increases as compared to a normal solar simulator using a single light source.
  (iv) Adjustment of the solar simulator with variable spectrum is cumbersome, and its control requires skill.

The multi-source method can accurately measure the output characteristics of a stacked solar cell. However, due to the above reasons, the light-receiving area of the solar cell to be measured is limited to the minimal area of laboratory level, and it is hard to measure a cell, module, or array having an area more than 400 cm$^2$. Even when a measuring apparatus for the multi-source method can be manufactured, the cost is very high. In addition, the multi-source method cannot be used for measurement using outdoor sunlight.

SUMMARY OF THE INVENTION

The present invention has been made to solve the above-described problems individually or altogether, and has as its object to accurately measure photoelectric conversion characteristics at low cost without being affected by the light-receiving area and form of the object to be measured, measurement position, and measurement light.

According to a preferred aspect of the present invention, the foregoing object is attained by providing a method of measuring photoelectric conversion characteristics of a test object to be tested by varying voltage to be applied to an object and measuring a current vs. voltage characteristic of the object, comprising the steps of obtaining a current vs. voltage characteristic of a reference object, which has similar construction to the test object, in standard test conditions, measuring the current vs. voltage characteristics of the test and reference objects in light irradiation, and calculating the photoelectric conversion characteristics of the test object in accordance with the measured current vs. voltage characteristics of the test and reference objects, and the current vs. voltage characteristic of the reference object obtained in the standard test conditions.

According to a preferred aspect of the present invention, the foregoing object is also attained by providing a measuring apparatus for measuring photoelectric conversion characteristics of a test object to be tested by measuring a current vs. voltage characteristic of the test object in light irradiation, comprising a voltage controller, arranged to control voltage applied to an object, a detector, arranged to detect voltage and current of the object, and a calculator, arranged to calculate the photoelectric conversion characteristics of the test object in accordance with the measured current vs. voltage characteristics of the test object and a reference object which has similar construction to the test object, and a current vs. voltage characteristic, which has been measured in advance, of the reference object in standard test conditions.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5 is a table showing the measurement results in Example 1;

FIG. 6 is a table showing the calculation results of short-circuit current that a component cell generates in the cell in the standard test conditions in Example 1;

FIG. 7 is a table showing the measurement results in Comparative Example 1;

FIG. 8 is a table showing the verification results in Example 1;

FIG. 9 is a table showing the measurement results in Example 2;

FIG. 10 is a table showing the verification results in Example 2;

FIG. 11 is a table showing the measurement results in Example 3;

FIG. 12 is a table showing the verification results in Example 3;

FIG. 13 is a table showing the measurement results in Example 4;

FIG. 14 is a table showing the verification results in Example 4;

FIG. 15 is a table showing the measurement results in Example 5;

FIG. 16 is a table showing the verification results in Example 5;

FIG. 17 is a table showing the measurement results in Example 6;

FIG. 18 is a table showing the verification results in Example 6; and

DETAILED DESCRIPTION OF THE PREFERRED EMBODIMENTS

Figure 1:
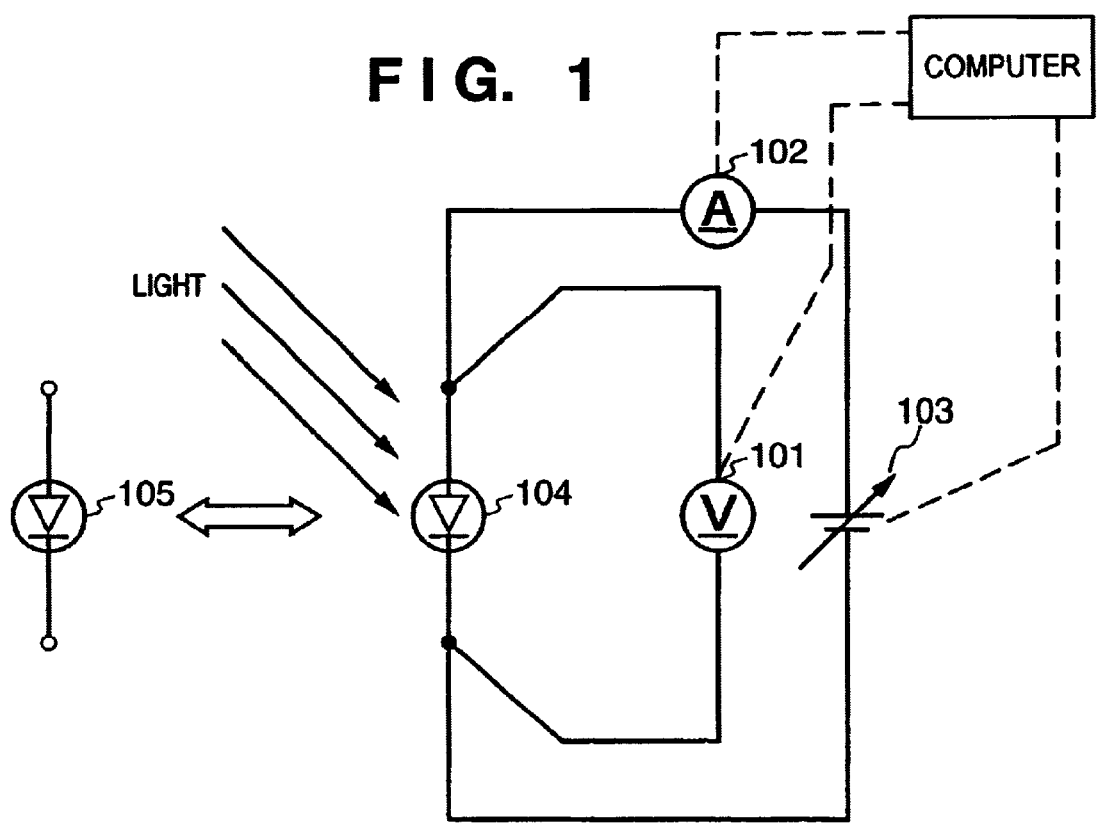
FIG. 1 is a view for explaining the arrangement of a measuring apparatus according to an embodiment.

A measuring system according to an embodiment of the present invention will be described below in detail with reference to the accompanying drawings by exemplifying a solar cell.

[Reference Photoelectric Conversion Device]

A stacked reference photoelectric conversion device is the most important element in this embodiment. If the device is a solar cell, it is called a stacked reference solar cell and will be referred to as a "reference cell" or "reference object" here. A stacked photoelectric conversion device to be measured will be referred to as a "sample cell", "measured object" or "test object". Items required for a reference cell will be described below.

(A) The reference cell has the same structure as that of a sample cell.

That is, the reference cell is preferably formed from the same materials as those of the sample cell. At least the semiconductor portion for executing photoelectric conversion must be formed from the same materials in the same way as in the sample cell. With this structure, the spectral response of each component cell in the reference cell becomes similar to that in the sample cell, and the output characteristics of the sample cell can be accurately corrected. However, the semiconductor layers need not have the same thickness.

(B) A component cell (to be referred to as a current-limiting cell" hereinafter) that limits the short-circuit current of the reference cell is preferably the same as that of the sample cell.

Which component cell functions as a current-limiting cell changes depending on the spectrum of irradiation light. At least under the above-described standard test conditions, the current-limiting cell of the reference cell is preferably the same as that of the sample cell. When the current-limiting cells are the same, the short-circuit current of the sample cell can be accurately corrected.

(C) The power generation portion area of the reference cell preferably approximates the power generation portion area of the minimum unit portion formed on one substrate that constructs the sample cell within the range of ±20% or less, more preferably within the range of ±10% or less, and most preferably within the range of ±5% or less.

This is because when the power generation portion area of the reference cell approximates that of the sample cell, any error due to the positional variation in irradiation light can be largely reduced. When the sample cell is made as a so-called module or array in which a plurality of stacked photoelectric conversion devices are connected in series and/or in parallel, the power generation area of the minimum unit portion (to be referred to as a "submodule" hereinafter) on the single substrates that are connected in series and/or in parallel need only approximate the power generation portion area of the reference cell.

(D) The characteristics of the reference cell are preferably processed and stabilized over time.

When the characteristics of the reference cell are stable against light, heat, and humidity, the reliability of the current vs. voltage characteristic of the reference cell in the standard test conditions becomes high, and the output characteristics of the sample cell can be accurately corrected. In addition, the time interval of current vs. voltage characteristic re-measurement in the standard test conditions can be increased.

(E) The current vs. voltage characteristic of the reference cell in the standard test conditions is preferably measured in advance.

To measure the current vs. voltage characteristic in the standard test conditions, either the multi-source method or another known measuring method can be used. If the area of the reference cell is large, it is difficult to measure the characteristic using the multi-source method. In this case, the measurement is preferably done outdoors on a day when the standard sunlight conditions or equivalent conditions are satisfied (standard sunlight method). Any method other than the standard sunlight method can be used as long as it can reproduce almost the same current vs. voltage characteristic as that under standard sunlight.

(F) The temperature coefficient of the current vs. voltage characteristic of the reference cell is preferably known.

More specifically, the temperature coefficients of the open-circuit voltage, short-circuit current, and fill factor are preferably known. If it is hard to measure the temperature coefficient of the reference cell itself, the temperature coefficient value of an equivalent stacked photoelectric conversion device may be used. In measuring the sample cell using the reference cell, the temperature of the reference cell is preferably adjusted to 25° C. If it is difficult to adjust the temperature, temperature correction is performed using the temperature coefficient, and the characteristic at 25° C. is obtained.

(G) A short-circuit current Jref.n generated in the reference cell by the nth component cell of the reference cell in the standard test conditions preferably falls within the range of ±20%, and more preferably, within the range of ±10% of a short-circuit current Jsam.n generated in the sample cell by the nth component cell of the sample cell in the standard test conditions. That is, equation (2) or (3) below is preferably satisfied.

Jref.n or Jsam.n cannot be directly measured. However, letting $Qr.n(\lambda)$ and $Qs.n(\lambda)$ be the spectral responses of the respective component cells, when the products of the spectral responses and a spectrum $Eo(\lambda)$ of standard sunlight are integrated across wavelengths that include the spectral responses of the cells, Jref.n and Jsam.n can be obtained. That is, Jref.n and Jsam.n can be obtained by equations (4) and (5) below. The spectral responses are measured by a known method. When the reference cell or sample cell has a large area, and the spectral response is hard to measure, it may be estimated from the spectral response measurement result for a small cell which is supposed to have almost the same spectral response as that of the reference cell or sample cell.

$$0.8 \times Jsam.n \leq Jref.n \leq 1.2 \times Jsam.n \tag{2}$$

$$0.9 \times Jsam.n \leq Jref.n \leq 1.1 \times Jsam.n \tag{3}$$

$$Jref.n = \int Eo(\lambda)Qr.n(\lambda)d\lambda \tag{4}$$

$$Jsam.n = \int Eo(\lambda)Qs.n(\lambda)d\lambda \tag{5}$$

where

Jref.n: the short-circuit current of the nth component cell of the reference cell Jsam.n: the short-circuit current of the nth component cell of the sample cell $Qr.n(\lambda)$: the spectral response of the nth component cell of the reference cell $Qs.n(\lambda)$: the spectral response of the nth component cell of the sample cell $Eo(\lambda)$: the spectrum of standard sunlight (H) Letting $Et(\lambda)$ be the spectrum of irradiation light, a so-called mismatch coefficient Mn given by $$Mn = \int Eo(\lambda)Qr \cdot n(\lambda)d\lambda \Big/ \int Et(\lambda)Qr \cdot n(\lambda)d\lambda \times \int Et(\lambda)Qs \cdot n(\lambda)d\lambda \Big/ \int Eo(\lambda)Qs \cdot n(\lambda)d\lambda \tag{6}$$

where $Et(\lambda)$: the spectrum of irradiation light at the time of measurement that represents the relationship between the reference cell and the sample cell preferably falls within the range of 0.98 to 1.02.

[Correction Method]

A method of correcting the result obtained by measuring the output characteristics of the stacked solar cell will be described next.

When the irradiance cannot be adjusted (a) The data of the current vs. voltage characteristic IVsam.t of the sample cell and the current vs. voltage characteristic IVref.t of the reference cell, which are obtained upon light irradiation at the time of measurement, are corrected to data when the irradiance is 1,000 W/m² and temperature is 25° C.

A known method is used for this correction. Let IVsam.t* and IVref.t* be the data after correction of the irradiance and temperature. When the irradiance falls within the range of 1,000±10 W/m², and the cell temperature falls within the range of 25° C.±2° C., correction need not be executed. In this case, we have IVsam.t*=IVsam.t IVref.t*=IVref.t (b) From the above-described IVsam.t* and IVref.t*, the following characteristic parameters of the reference cell and sample cell after correction of the irradiance and temperature are obtained (see FIGS. 2 and 3).

Pm.r*: the maximum power of the reference cell
Pm.s*: the maximum power of the sample cell
Voc.r*: the open-circuit voltage of the reference cell
Voc.s*: the open-circuit voltage of the sample cell
Isc.r*: the short-circuit current of the reference cell
Isc.s*: the short-circuit current of the sample cell
FF.r*: the fill factor of the reference cell
FF.s*: the fill factor of the sample cell
The fill factor FF is generally given by
FF=Pm/(Voc×Isc)

(c) The following characteristic parameters of the reference cell in the standard test conditions are obtained from the current vs. voltage characteristic IVref.o of the reference cell in the standard test conditions, which is measured in advance.

Figure 2:
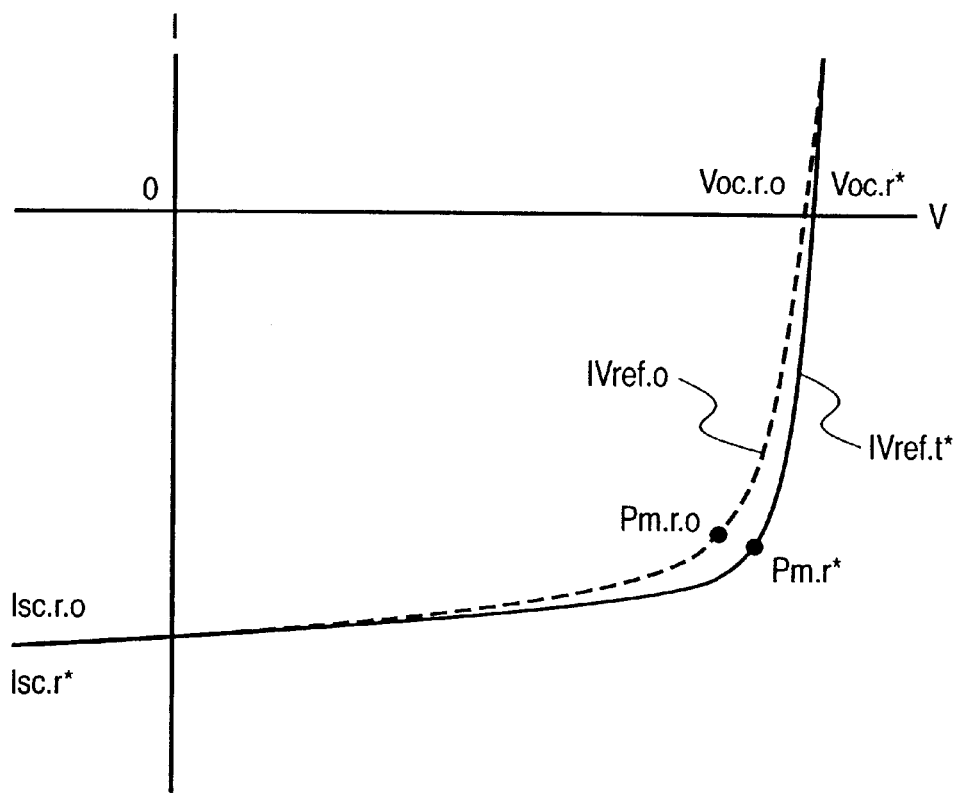
FIG. 2 is a graph showing the current vs. voltage characteristic (IVref.t) of a reference cell in light irradiation and the current vs. voltage characteristic (IVref.o) in standard test conditions.
Figure 3:
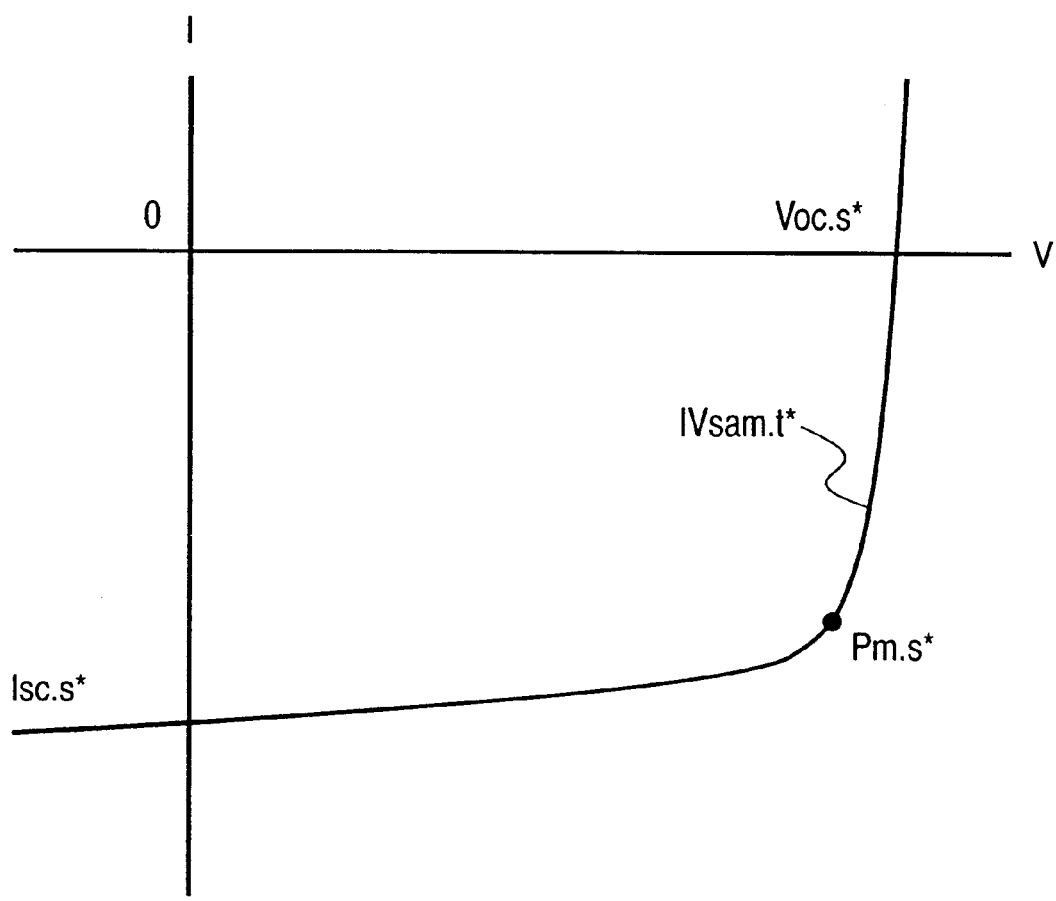
FIG. 3 is a graph showing the current vs. voltage characteristic (IVsam.t) of a sample cell in light irradiation.

Pm.r.o: the maximum power of the reference cell in the standard test conditions
Voc.r.o: the open-circuit voltage of the reference cell in the standard test conditions
Isc.r.o: the short-circuit current of the reference cell in the standard test conditions
FF.r.o: the fill factor of the reference cell in the standard test conditions (d) Since the spectrum of irradiation light is shifted from standard sunlight, the above-described IVref.t* and IVref.o have the shift shown in FIG. 2. Pm.s.o is calculated by correcting the maximum power Pm.s* of the sample cell by $$Pm.s.o = Pm.s \times Isc.r.o/Isc.r \times FF.r.o/FF.r \quad (7)$$

$$Pm.s.o = Pm.s \times Isc.r.o/Isc.r \times Pm.r.o/Pm.r \quad (8)$$

Equation (7) corrects the spectrum dependence of the fill factor FF and short-circuit current Isc of the cell but does not correct the spectrum dependence of the open-circuit voltage Voc. Equation (8) corrects the spectrum dependence of the open-circuit voltage Voc, too.

Except the short-circuit current Isc, the fill factor FF mainly has dependence on the spectrum. The spectrum dependence of the open-circuit voltage Voc is small. In addition, since the temperature coefficient of the open-circuit voltage Voc is generally larger than that of the short-circuit current or fill factor, the open-circuit voltage Voc is readily affected by a temperature measurement error or an error of temperature correction coefficient and also affected by the irradiance. That is, to correct the open-circuit voltage Voc, the influence of spectrum must be separated. If the influence can hardly be separated, correction is preferably inhibited in some cases.

Hence, when it is difficult to adjust the cell temperature to 25° C. or it is difficult to adjust the irradiance to 1,000 W/m², and the irradiance correction and temperature correction are supposed to contain errors, the influence of the spectrum on the open-circuit voltage Voc cannot be separated, and therefore, equation (7) is preferably used.

Conversely, when the cell temperature can be adjusted to 25° C., and the irradiance can be adjusted to 1,000 W/m², i.e., the errors in irradiance correction and temperature correction are supposed to be small, the influence of the spectrum on the open-circuit voltage Voc can be separated, and therefore, equation (8) is preferably used.

To execute the measurement based on this embodiment outdoors, the shift between the time for measuring the irradiance of light, the time for acquiring the current vs. voltage characteristic of the reference cell, and the time for acquiring the current vs. voltage characteristic of the sample cell is preferably 10 sec or less, more preferably 5 sec or less, and most preferably 2 sec or less. The irradiance and spectrum of outdoor sunlight change every moment. For this reason, when measurements to be compared are executed at the same timing as much as possible, the measurements can be done under almost the same sunlight conditions, and the measurement accuracy further improves.

When the irradiance can be adjusted (e) Like section (a) described above, the current vs. voltage characteristic of the reference cell is measured, and corrected with the irradiance and temperature.

(f) If Isc.r*>Isc.r.o, the irradiance of the light source is reduced. Conversely, if Isc.r*<Isc.r.o, the irradiance of the light source is increased.

(g) Sections (e) and (f) are repeated until Isc.r* and Isc.r.o match preferably at an accuracy of ±1%, and more preferably, at an accuracy of ±0.5%. When this condition is satisfied, it can be regarded that Isc.r*=Isc.r.o.

(h) Like section (a) described above, the current vs. voltage characteristic of the sample cell is measured, and corrected with the irradiance and temperature.

(i) The maximum power of the sample cell is corrected by equation (9). The maximum power of the sample cell may be corrected by equation (10).

$$Pm.s.o = Pm.s^* \times FF.r.o/FF.r^* \quad (9)$$

$$Pm.s.o = Pm.s^* \times Pm.r.o/Pm.r^* \quad (10)$$

The manner the equations are used is the same as that for equations (7) and (8). In this case, the irradiance is adjusted to 1,000 W/m². Hence, when temperature correction contains an error, and the influence of the spectrum on the open-circuit voltage Voc cannot be separated, equation (9) is preferably used. When the error in temperature correction is small, and the influence of the spectrum on the open-circuit voltage Voc can be separated, equation (10) is preferably used.

(j) When the irradiance of the light source is stable over time, sections (e) to (g) may be omitted, and different sample cells may be continuously measured.

In accordance with the time stability of the light source, processes corresponding to sections (e) to (g) are inserted every predetermined time to adjust the irradiance of the light source. When the spectral characteristic of the sample cell changes to change the current-limiting cell or the mismatch coefficient Mn deviates from the range of 0.98 to 1.02, preferably, the reference cell is changed to an appropriate cell from the above-described viewpoint, and sections (e) to (g) are executed again.

Simplified measuring method when the irradiance can be adjusted (k) Like section (a) described above, the current vs. voltage characteristic of the reference cell is measured, and corrected with the irradiance and temperature.

(l) If Pm.r*>Pm.r.o, the irradiance of the light source is reduced. Conversely, if Pm.r*<Pm.r.o, the irradiance of the light source is increased.

(m) Sections (k) and (l) are repeated until Pm.r* and Pm.r.o match preferably at an accuracy of ±1%, and more preferably, at an accuracy of ±0.5%. At this time, we can assume $$Pm.r^* = Pm.r.o \qquad (11)$$

(n) Like section (a) described above, the current vs. voltage characteristic of the sample cell is measured, and corrected with the irradiance and temperature. In this case, the maximum power can be regarded as Pm.s.o=Pm.s*. However, the short-circuit current Isc and fill factor FF are inaccurate. This method can be preferably used when an emphasis is placed on the measurement speed, and the maximum power Pm.s as accurate as possible is to be measured by simple correction.

(o) Sample cells can be continuously measured on the basis of the same reference as in section (f) described above.

[Sample Cell]

The sample cell has a structure in which a plurality of semiconductor junctions are stacked. When an electrode is extracted from each of two semiconductor junctions stacked, the cell is called a four-terminal type. When a plurality of semiconductor junctions are connected in series, and electrodes are formed at the two ends, the cell is called a two-terminal type. The measuring method of this embodiment can be applied to either sample cell and offers a remarkable effect especially for the two-terminal type cell.

Examples of sample cell (stacked photoelectric conversion device) are a solar cell, photodiode, photosensor, and electrophotographic photosensitive body.

Examples of semiconductor junction are a pn junction, pin junction, and MIS junction.

Semiconductor materials include crystal, polycrystal, crystallite, and amorphous materials. Examples of substance are group IV or IV compounds such as Si, SiC, SiGe, C, and Ge, group III–V compounds such as GaAs, AlGaAs, InP, and InSb, group II–VI compounds such as ZnSe, ZnO, CdS, CdTe, and $Cu_2S$, group $I–III–VI_2$ compounds such as $CuInSe_2$ and $CuInS_2$, organic semiconductors, and mixtures of the above-described compounds.

For the measuring method of this embodiment, the size and area of the sample cell are not limited. For, e.g., a solar cell, device such as a cell, submodule, module and array with various sizes and areas can be measured.

The temperature coefficient of the current vs. voltage characteristic of the sample cell is preferably known. More specifically, the temperature coefficients of the open-circuit voltage, short-circuit current, and fill factor are preferably known. If it is hard to measure the temperature coefficient of the sample cell itself, the temperature coefficient value of an equivalent stacked photoelectric conversion device may be used. In measuring the sample cell, the temperature of the sample cell is preferably adjusted to 25° C. If it is difficult to adjust the temperature, the characteristic must be corrected using the above-described temperature coefficient, and the characteristic at 25° C. must be obtained.

[Irradiation Light]

Light used in the measuring method of this embodiment may be either natural light or light from an artificial light source. For, e.g., a solar cell, sunlight or a pseudo sunlight source is preferably used.

When sunlight is used, the measurement is preferably executed within the irradiance range of 500 to 1,500 W/m², and more preferably, 800 to 1,200 W/m². Since the temperature of the reference cell or sample cell readily increases, the sunlight is shielded before the start of measurement and sent onto the reference cell or sample cell immediately before the measurement. With this operation, since any increase in cell temperature can be suppressed, and the correction amount by the above-described temperature coefficient becomes small, any error by temperature correction is reduced, and the measurement can be more accurately done.

When a pseudo sunlight source is used, a known solar simulator is preferably used. As the lamp of light source, a xenon lamp or metal halide lamp is preferably used. The lighting method can be either continuous lighting or pulse lighting. When the pseudo sunlight source is used, the spectrum changes to some extent in accordance with the lamp use time. Since the measuring method of this embodiment corrects an error due to the spectrum, the output characteristics of the stacked photoelectric conversion device which is sensitive to the spectrum can be accurately measured.

When a cell or module having a large area is to be measured, the solar simulator must also have a large effective irradiation area. In addition, a solar simulator excellent in both the degree of spectral coincidence and the positional variation in irradiance is required. As described above, as the area becomes large, the manufacturing cost of the solar simulator acceleratingly increases. In the measuring method of this embodiment, since an emphasis is placed on the positional variation in irradiance of the solar simulator while a compromise can be made for the degree of spectral coincidence, an accurate measuring system for coping with a large area is implemented at low cost.

[Irradiance Detector]

The irradiance of light with which the cell is irradiated can be detected by a known solar cell, photodiode, or pyrheliometer using a thermocouple. Finally, the irradiance is calibrated by the reference cell. Hence, the reference cell may be used as the irradiance detector from the beginning.

[Voltage Detector and Current Detector]

As voltage and current detectors 101 and 102 shown in FIG. 1, a known means such as a digital multi-meter or a combination of a resistor and analog-digital conversion card can be used.

[Power Supply]

As a power supply 103 for supplying power to a cell 104 or 105 shown in FIG. 1, e.g., a bipolar power supply capable of changing the voltage is used. If the voltage to be applied to the cell 104 or 105 can be changed or swept, a known means such as an electronic load or discharge of charges accumulated in a capacitor can be used in place of the power supply 103.

[Spectrometer]

To calculate the above-described mismatch coefficient Mn, the spectrum of irradiation light must be measured. To do this, a known spectroradiometer is preferably used.

[Measurement Control and Data Processing Section]

As a means for controlling the above measurement devices and a means for processing measured data, a measurement control and data processing section such as a personal computer is preferably used.

[Measurement Procedure]

Figure 19:
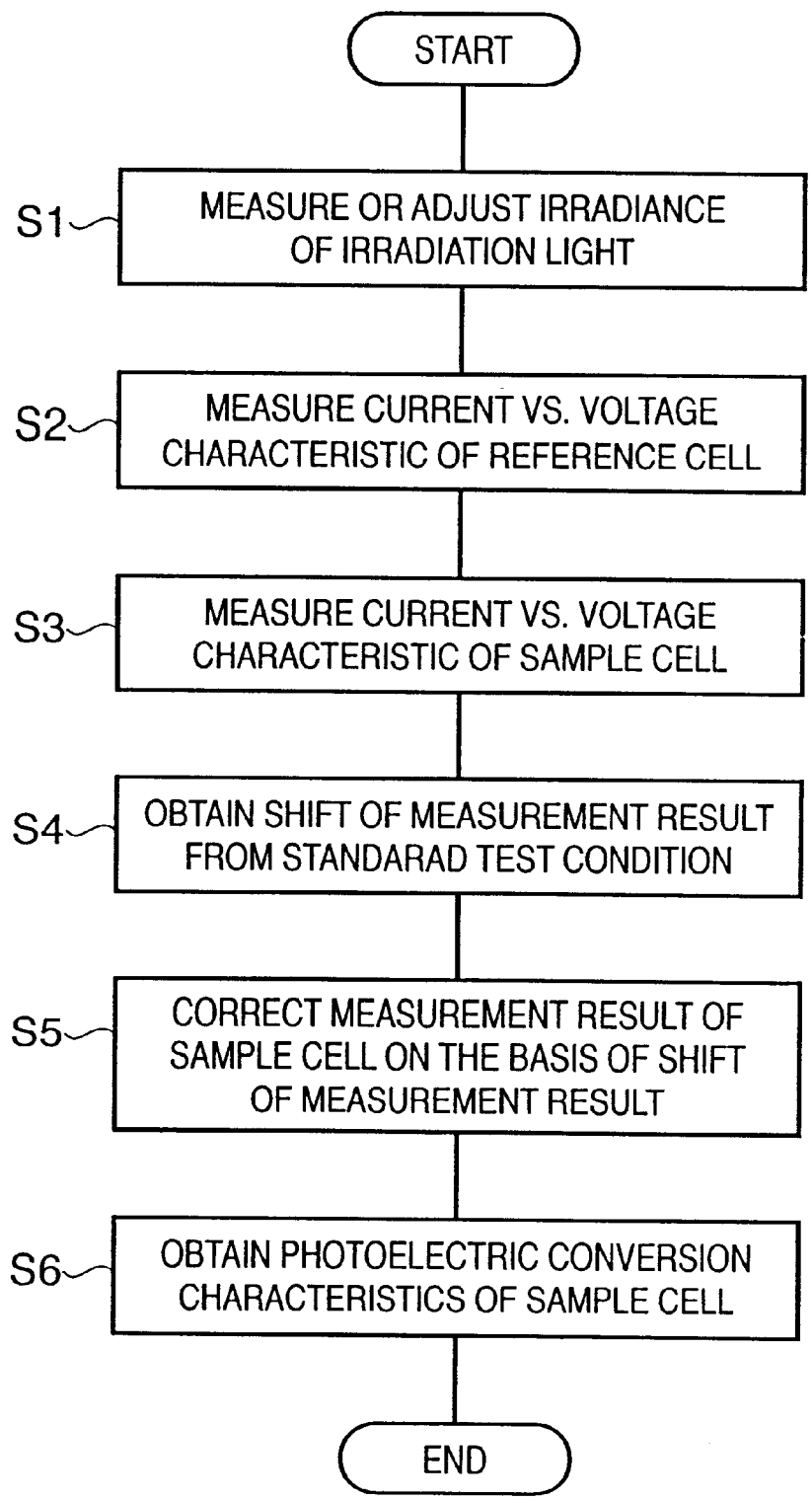
FIG. 19 is a flow chart showing the measurement procedure of the embodiment.

FIG. 19 is a flow chart showing the measurement procedure of this embodiment.

First, the irradiance of irradiation light is measured or adjusted by the irradiance detector (S1). The current vs. voltage characteristic of the reference cell is measured (S2), and the current vs. voltage characteristic of the sample cell is measured (S3). That is, while changing the voltage to be applied to the object to be measured, the voltage applied and current supplied to the object to be measured are measured, thereby obtaining the current vs. voltage characteristics. Steps S2 and S3 are preferably executed at least within a short time.

The current vs. voltage characteristic of the reference cell in the standard test conditions is compared with the measurement result of the current vs. voltage characteristic of the reference cell, thereby obtaining a shift of the measurement result from the standard test condition on the basis of the shift of the irradiation light from the standard test condition (S4). On the basis of the obtained shift of the measurement result, the measurement result of the current vs. voltage characteristic of the sample cell is corrected (S5), and the photoelectric conversion characteristics of the sample cell are obtained (S6).

EXAMPLE 1

The output characteristics of a triple solar cell having a three-layered structure including a top cell with a pin junction using amorphous silicon (to be referred to as "a-Si" hereinafter) for an i-layer, a middle cell with a pin junction using amorphous silicon germanium (to be referred to as "a-SiGe" hereinafter) for an i-layer, and a bottom cell with a pin junction using a-SiGe for an i-layer were measured by a known pulse-light-type solar simulator using a xenon lamp as a light source.

The triple solar cell had a size of about 1 cm×1 cm formed on a single stainless steel substrate and was in a single unit state before cells were connected in series or in parallel. No surface protective layer was formed. The solar simulator had an effective irradiation area of about 10 cm×10 cm. The time variation ratio of the irradiance was ±1% or less, and the positional variation in irradiance was ±2% or less.

As a power supply 103, a known bipolar power supply was used. The voltage was swept by a personal computer. As voltage and current detectors 101 and 102, a known digital multi-meter was used, and the data of the measured voltage and current were obtained by the personal computer. With the above arrangement, the current vs. voltage characteristic of the cell was acquired.

As the reference cell, a triple solar cell having the same structure and same size as those of the sample cell was used, which had been irradiated with light from the solar simulator for 1,000 hrs and degraded to stabilize the characteristic change over time in advance. The current vs. voltage characteristic of the reference cell in the standard test conditions was measured in advance by the multi-source method. When the characteristics of the reference cell are stabilized, the characteristics of the reference cell do not change even when it is irradiated with light in measurement, and an accurate measurement result can be obtained. In addition, the time interval of re-measurement of the current vs. voltage characteristic of the reference cell in the standard test conditions can be increased.

As a irradiance detector, the reference cell was used, and the irradiance of the solar simulator was adjusted to 1,000 W/m$^2$ such that the short-circuit current of the reference cell matched that in the standard test conditions. Hence, in this example, it can be regarded that Isc.r*=Isc.r.o, as described above about the correction method.

A copper block and Peltier element were arranged on the lower surface of the stainless steel substrate of each of the sample cell and reference cell to adjust the cell temperature to 25° C.±1° C. Hence, this example corresponds to the case described above about the correction method wherein "the irradiance can be adjusted". Since the irradiance and cell temperature were adjusted to 1,000 W/m$^2$ and 25° C., irradiance correction and temperature correction for the obtained current vs. voltage characteristic were unnecessary.

A maximum power Pm.s* was obtained from the current vs. voltage characteristic of the sample cell, FF.r* was obtained from the current vs. voltage characteristic of the reference cell, FF.r.o was obtained from the current vs. voltage characteristic of the reference cell in the standard test conditions, which was measured in advance, and correction was performed by equation (9) to obtain a maximum power Pm.s.o. FIG. 5 shows the results.

Figure 4:
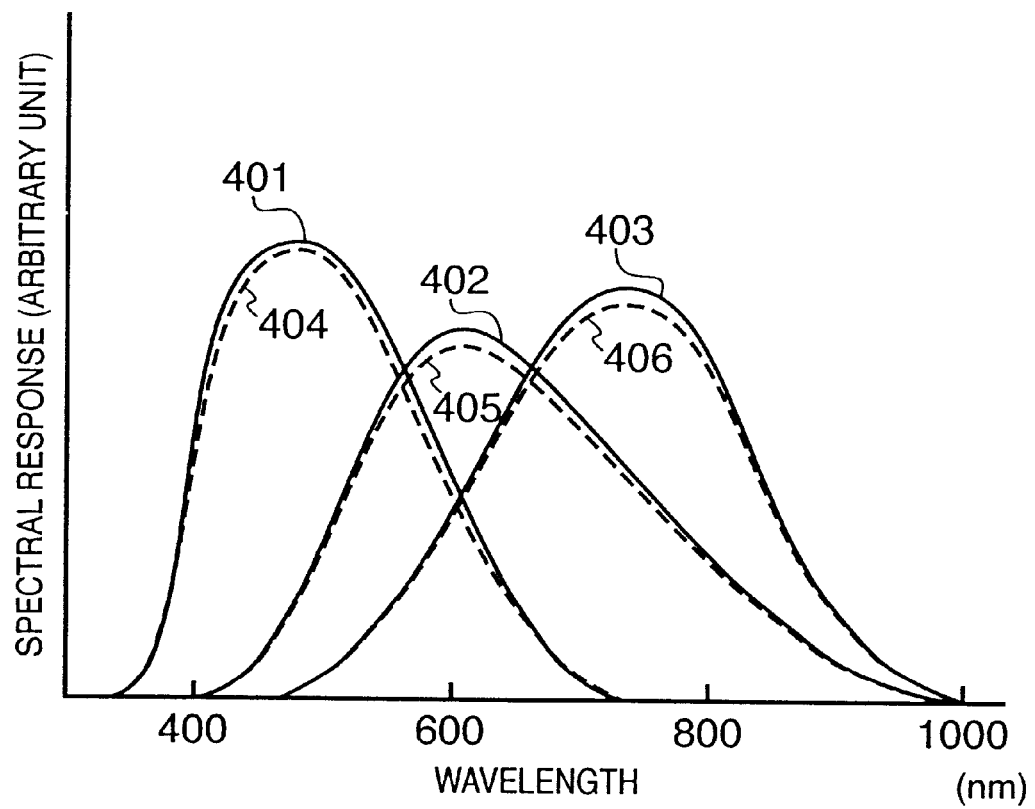
FIG. 4 is a graph showing the spectral response (solid curve) of a sample cell and the spectral response (broken curve) of a reference cell in Example 1.

When the spectral response of a sample which was prepared simultaneously with the sample cell and supposed to have the same characteristics as those of the sample cell was measured by a known method, characteristics indicated by solid curves 401 to 403 shown in FIG. 4 were obtained. In addition, when the spectral response of the reference cell was measured, characteristics indicated by broken curves 404 to 406 shown in FIG. 4 were obtained. Since the reference cell was degraded until the characteristics stabilized, the spectral response and short-circuit current of each component cell were slightly smaller than those of the sample cell.

When the measured spectral responses and the spectrum of standard sunlight were integrated at wavelengths in accordance with equations (4) and (5), the results shown in FIG. 6 were obtained. FIG. 6 also shows results obtained by measuring the spectrum of the solar simulator by a known spectroradiometer and calculating the mismatch coefficient by equation (6).

As is apparent from FIG. 6, for both the sample cell and the reference cell, the component cell for limiting the current in the entire triple solar cell is the top cell. In addition, the ratio of the short-circuit currents of the component cells in the sample cell and reference cell falls within the range of ±10%. Furthermore, the mismatch coefficient of each component cell of the sample cell with respect to the reference cell in light irradiation is 0.99 to 1.00.

As described above, since the reference cell has a spectral response approximate to that of the sample cell and the same current-limiting cell as that of the sample cell, and the mismatch coefficient is almost 1, the accuracy of the correction results for the output characteristics of the sample cell improves.

Comparative Example 1

To verify the accuracy of the measurement results of Example 1 described above, the sample cell of Example 1 was measured by the multi-source method.

That is, using a solar simulator (multi-source simulator) having an adjustable spectrum, the spectrum of the solar simulator was adjusted such that the current of each of the top cell, middle cell, and bottom cell of the sample cell equaled the value in the standard test conditions. The spectrum of the solar simulator at this time was measured using a known spectroradiometer.

In accordance with the same procedure as in Example 1 except the use of the multi-source simulator, the same reference cell as in Example 1 was used, and the current vs. voltage characteristic was measured while adjusting the irradiance of the solar simulator to 1,000 W/m$^2$ by the reference cell and the temperature of the reference cell to 25° C. In this case, the output characteristics were not corrected by the reference cell. FIG. 7 shows the measurement results.

FIG. 8 shows results obtained by dividing the results of Example 1 before and after correction by the values shown in FIG. 7 and representing the increase/decrease in each value by percentage. As is apparent from the results shown in FIG. 8, with the measuring method of this embodiment using no apparatus such as a multi-source simulator, i.e., the measuring method of correcting measurement results obtained using a general solar simulator, accurate measurement results almost the same as those by the multi-source method can be obtained.

EXAMPLE 2

The same sample cell as in Example 1 was measured in accordance with the same procedure as in Example 1. FIG. 9 shows results obtained by correcting the measurement results not by equation (9) but by equation (10). FIG. 10 shows results obtained by dividing the results of Example 2 before and after correction shown in FIG. 9 by the values shown in FIG. 7 and representing the increase/decrease in each value by percentage. As is apparent from the results shown in FIG. 10, even with the measuring method of this embodiment using equation (10), accurate measurement results almost the same as those by the multi-source method can be obtained.

EXAMPLE 3

The output characteristics of a double solar cell having a two-layered structure including a top cell with a pin junction using a-Si for an i-layer and a bottom cell with a pin junction using micro-crystallite silicon (to be referred to as "$\mu$c-Si" hereinafter) for an i-layer were measured by a known solar simulator using a xenon lamp as a light source.

The double solar cell was a submodule which had a size of about 25 cm×18 cm formed on a single stainless steel substrate and was in a single unit state before submodules were connected in series or in parallel. No surface protective layer was formed. The solar simulator had an effective irradiation area of about 130 cm×80 cm. The positional variation in irradiance was ±3% or less, and the positional variation in irradiance within the area of the submodule was ±1.5% or less.

As a power supply 103, a known electronic load was used. The voltage was swept by a personal computer. As voltage and current detectors 101 and 102, a combination of a resistor and analog-digital conversion card was used, and the data of the measured voltage and current were obtained by the personal computer. With the above arrangement, the current vs. voltage characteristic of the submodule was acquired.

As the reference submodule, a double solar cell submodule having the same structure and same size as those of the sample submodule was used, which had been irradiated with light from the solar simulator for 1,000 hrs and degraded to stabilize the characteristic change over time in advance. The current vs. voltage characteristic of the reference submodule was measured outdoors in advance when sunlight satisfied the standard sunlight conditions or equivalent meteorological conditions, and the irradiance and temperature were corrected, thereby obtaining the current vs. voltage characteristic in the standard test conditions.

When the area of the reference submodule was made to match that of the sample submodule, any error due to the positional variation in irradiance of the solar simulator could be largely reduced.

As a irradiance detector, the reference submodule was used, and the irradiance of the solar simulator was adjusted to 1,000 W/m$^2$ such that the short-circuit current of the reference submodule matched that in the standard test conditions. Hence, in this example, it can be regarded that Isc.r*=Isc.r.o, as described above about the correction method.

The temperature of the sample submodule was 27° C. and the temperature of the reference submodule was 27.5° C. The current vs. voltage characteristics of the two submodules were corrected by temperature correction coefficients that were obtained using a double solar cell having the same structure as described above in advance.

A maximum power Pm.s* was obtained from the corrected current vs. voltage characteristic of the sample submodule, FF.r* was obtained from the corrected current vs. voltage characteristic of the reference submodule, FF.r.o was obtained from the current vs. voltage characteristic of the reference submodule in the standard test conditions, which was measured in advance, and correction was performed by equation (9) to obtain a maximum power Pm.s.o. FIG. 11 shows the results.

The current vs. voltage characteristic of the sample submodule was measured outdoors when sunlight satisfied the standard sunlight conditions or equivalent meteorological conditions, and the irradiance and temperature were corrected, thereby acquiring the current vs. voltage characteristic in the standard test conditions. The output characteristics Pm, Voc, Isc, and FF obtained from the results were compared with the output characteristics in measurement and after correction shown in FIG. 11. FIG. 12 shows the comparison results.

As is apparent from the results shown in FIG. 12, when the measurement results obtained using a general solar simulator are corrected using the measuring method of this embodiment, accurate measurement results almost the same as those by the standard sunlight method can be obtained without executing outdoor measurement by standard sunlight under strict meteorological conditions.

EXAMPLE 4

The output characteristics of a double solar cell module having a two-layered structure including a top cell with a pin junction using a-Si for an i-layer and a bottom cell with a pn junction using single-crystal silicon (to be referred to as "c-Si" hereinafter) for an n-layer were measured outdoors.

The double solar cell module was a so-called super straight module having a size of about 95 cm×55 cm in which 15 serial×3 parallel double solar cells each formed on a single-crystal silicon wafer with a size of about 10 cm×10 cm were connected. The outdoor measurement was executed on a fine day when the angle of incidence direct sunlight was 10° or less and the irradiance was 800 W/m$^2$ or more. Since the measurement was executed not under limited meteorological conditions for the standard sunlight method but under more general meteorological conditions, the spectrum of sunlight did not satisfy the conditions of standard sunlight.

As a power supply 103, a known electronic load was used. The voltage was swept by the function of the electronic load. As voltage and current detectors 101 and 102, a known digital multi-meter was used, and the data of the measured voltage and current were acquired by a notebook-type personal computer. With the above arrangement, the current vs. voltage characteristic of the module was acquired.

As the reference module, a double solar cell submodule having the same module structure and a size of about 10 cm×10 cm was used, which had been irradiated with light from a solar simulator for 1,000 hrs and degraded to stabilize the characteristic change over time in advance. The current vs. voltage characteristic of the reference module in the standard test conditions was measured in advance by the multi-source method.

When the area of the reference module was made to match that of the sample sub-module, any error in temperature correction and any measurement error in output characteristics are reduced. The reference module and sample module were installed on the same plane of the same frame, the angles of incidence of direct sunlight were equalized, and the current vs. voltage characteristics were simultaneously measured, thereby equalizing the measurement conditions.

As a irradiance detector, the reference module was used. The irradiance was measured by the short-circuit current of the reference module.

The temperature of the sample module was calculated on the basis of the temperature coefficient from an open-circuit voltage Voc measured indoors using a pulse-type solar simulator while controlling the temperature to 25° C. and the open-circuit voltage Voc measured outdoors. The temperature of the reference module was also calculated on the basis of the temperature coefficient from the open-circuit voltage Voc measured indoors using the multi-source method while controlling the temperature to 25° C. and the open-circuit voltage Voc measured outdoors. After that, temperature correction and irradiance correction were executed for the current vs. voltage characteristics of the two modules on the basis of the temperature correction coefficient values and series resistance values obtained using a double solar cell having the same structure as described above.

A maximum power Pm.s* was obtained from the current vs. voltage characteristic of the sample module after temperature correction and irradiance correction, FF.r* was obtained from the current vs. voltage characteristic of the reference module after temperature and irradiance corrections, FF.r.o was obtained from the current vs. voltage characteristic of the reference module in the standard test conditions, which was measured in advance, and correction was performed by equation (7) to obtain a maximum power Pm.s.o. In this example, even when the correction was performed using equation (8), the resultant value was the same as that obtained using equation (7). FIG. 13 shows the results.

The current vs. voltage characteristic of the sample module was measured outdoors when sunlight satisfied the standard sunlight conditions or equivalent meteorological conditions, and the irradiance and temperature were corrected, thereby acquiring the current vs. voltage characteristic in the standard test conditions. The output characteristics Pm, Voc, Isc, and FF obtained from the results were compared with the output characteristics in measurement and after correction shown in FIG. 13. FIG. 14 shows the comparison results.

As is apparent from the results shown in FIG. 14, when the results obtained by outdoor measurement are corrected using the measuring method of this embodiment, accurate measurement results almost the same as those by the standard sunlight method can be obtained without waiting for a day when the standard sunlight conditions are obtained under strict meteorological conditions.

In Japan, the meteorological conditions suitable for the standard sunlight method can be obtained in only several days a year. However, according to the measuring method of this embodiment, the measurements can be executed any number of times a day as far as a irradiance of 800 W/m$^2$ or more is obtained on a fine day, and the number of days when the outdoor measurement is possible can be largely increased.

EXAMPLE 5

A triple solar cell identical to that of Example 1 was formed on a single stainless steel substrate having a size of about 25 cm×35 cm to prepare a submodule. Five submodules were connected in series using a zinc-plated steel sheet as a support, and a surface protective layer, bypass diode, junction box, and the like were added to form a roofing-material-shaped module having a size of about 140 cm×42 cm. Twenty modules were connected in series to form a string, and five strings are connected in parallel to form a solar cell array. The output of the solar cell array was 3.2 kW. This solar cell array also functions as a roofing material and is installed as the roof of a building and connected to a power conditioner such as an inverter through a connection box so as to function as part of a photovoltaic power generation system.

The output characteristics of the solar cell array that was kept installed on the roof were measured by sunlight. The measurement was executed on a fine day when the angle of incidence of direct sunlight was 10° or less and the irradiance was 800 W/m$^2$ or more. Since the measurement was executed not under limited meteorological conditions for the standard sunlight method but under more general meteorological conditions, the spectrum of sunlight did not satisfy the conditions of standard sunlight.

After the solar cell array is disconnected from the power conditioner in the connection box, the output from the solar cell array was connected to a power supply 103. As the power supply 103, a known method of discharging electric charges accumulated in a capacitor was used. The voltage was swept by discharging the capacitor. As voltage and current detectors 101 and 102, a known digital multi-meter was used, and the data of the measured voltage and current were obtained by a notebook-type personal computer. With the above arrangement, the current vs. voltage characteristic of the solar cell array was acquired.

As the reference module, a triple solar cell submodule having the same module structure as that of the sample and a size of about 25 cm×35 cm was used, which had been degraded by injecting a current for 1,500 hrs by a known forward bias current injection method to stabilize the characteristic change over time in advance. The current vs. voltage characteristic of the reference module in the standard test conditions was measured in advance by the standard sunlight method.

When the area of the reference module was made to match that of the submodule of a solar cell array as a sample, any error in temperature correction and any measurement error in output characteristics are reduced. The reference module and the solar cell array as the sample were set at the same angle with respect to sunlight to equalize the angles of incidence of direct sunlight, and the current vs. voltage characteristics were simultaneously measured, thereby equalizing the measurement conditions.

As a irradiance detector, the reference module was used. The irradiance was measured by the short-circuit current of the reference module.

The temperature of the solar cell array was obtained by weighted-averaging temperatures measured at a plurality of points by a radiation thermometer from the array surface side at an estimated angle that generated no shadow on the array. The temperature of the reference module was measured by a sheet-type thermocouple of copper constantan and a digital thermometer, which were bonded to the almost central portion of the lower surface of the module. After that, temperature correction and irradiance correction were executed for the current vs. voltage characteristics of the module and the array on the basis of the temperature correction coefficient values and series resistance values obtained using a triple solar cell having the same structure as described above. In addition, the degree of dirt on the solar cell array was estimated, and the current vs. voltage characteristic was corrected using a dirt correction coefficient.

A maximum power Pm.s* was obtained from the current vs. voltage characteristic of the solar cell array after temperature correction, irradiance correction, and dirt correction, FF.r* was obtained from the current vs. voltage characteristic of the reference module after temperature correction and irradiance correction, FF.r.o was obtained from the current vs. voltage characteristic of the reference module in the standard test conditions, which was measured in advance, and correction was performed by equation (7) to obtain a maximum power Pm.s.o. FIG. 15 shows the results.

It was difficult to measure the current vs. voltage characteristic of the solar cell array outdoors under meteorological conditions under which the sunlight satisfied the standard sunlight conditions. To cope with this, in manufacturing a solar cell module that forms the solar cell array, the current vs. voltage characteristic of each module was measured using a pulse-light-type solar simulator, and the output characteristics were obtained in accordance with the same procedure as in Example 4. The output characteristics of 20 serial×5 parallel modules were synthesized to obtain the output characteristics of the solar cell array. Finally, the light-induced degradation ratio and loss amount due to the connection cable and blocking diode after installation of the solar cell array were corrected to obtain the corrected output characteristics of the solar cell array after construction of the solar cell array. The output characteristics were compared with the output characteristics in measurement and after correction shown in FIG. 15. FIG. 16 shows the comparison results.

As is apparent from the results shown in FIG. 16, when the measurement results obtained by outdoor measurement are corrected using the measuring method of this embodiment, accurate measurement results almost the same as those obtained by synthesizing measurement results by the standard sunlight method can be obtained without waiting for a day when the standard sunlight conditions are obtained under strict meteorological conditions.

EXAMPLE 6

The output characteristics of a photosensor having a stacked structure including a top cell with a pn junction by AlGaAs and a bottom cell with a pn junction by GaAs were measured by a known solar simulator using a metal halide lamp as a light source.

The photosensor was formed on a single GaAs wafer and then cut into a size of about 1 cm×1 cm and was in a state before a sensor unit was formed. The solar simulator had an effective irradiation area of about 10 cm×10 cm. The time variation ratio of the irradiance was ±1% or less, and the positional variation in irradiance was ±2% or less.

As a power supply 103, a known electronic load was used. The voltage was swept by a personal computer. As voltage and current detectors 101 and 102, a combination of a resistor and analog-digital conversion card was used, and the data of the measured voltage and current were acquired by the personal computer. With the above arrangement, the current vs. voltage characteristic of the photosensor was acquired.

As the reference cell, 100 stacked photosensors having the same size were prepared, and one photosensor having average output characteristics and spectral response was selected therefrom and used. The current vs. voltage characteristic of the reference cell in the standard test conditions was measured in advance by the multi-source method.

When the area of the reference cell was made to match that of the sample, any error due to the positional variation in irradiance of the solar simulator could be largely reduced.

As a irradiance detector, the reference cell was used, and the irradiance of the solar simulator was adjusted to 1,000 $W/m^2$ such that the maximum power of the reference cell matched that in the standard test conditions, i.e., the above-described equation (11) of the correction method is satisfied.

A copper block and Peltier element were arranged on the lower surface of the substrate to adjust the temperatures of the sample and reference cells to 25° C.±1° C.

Hence, this example corresponds to the above-described case wherein the irradiance can be adjusted. Since the irradiance and the temperatures of the cell and sample were adjusted to 1,000 $W/m^2$ and 25° C., irradiance correction and temperature correction for the obtained current vs. voltage characteristic were unnecessary.

The calculation result of the output characteristic of the photosensor obtained by the above measurement is indicated in the column of power calibration measurement in FIG. 17.

As a comparison with the measuring method of this embodiment, measurement was executed in accordance with the same procedure as in the above-described example except that the irradiance of the solar simulator was adjusted not by matching the maximum powers such that equation (11) was satisfied but by matching the short-circuit current of the reference cell. FIG. 17 shows the measurement results in the column of current calibration measurement.

The current vs. voltage characteristic of the photosensor in the standard test conditions was measured by the multi-source method. The output characteristics Pm, Voc, Isc, and FF obtained from the results were compared with the output characteristics in power calibration measurement and current calibration measurement shown in FIG. 17. FIG. 18 shows the comparison results.

As is apparent from the results shown in FIG. 18, according to the measuring method of this embodiment, even when a general solar simulator is used, accurate maximum power measurement results almost the same as those by the multi-source method can be obtained without executing measurement by the multi-source method.

In the power calibration measurement of this example, since an emphasis is placed on the maximum power measurement, the maximum power measurement accuracy becomes higher than the conventional current calibration measurement, though the short-circuit current and fill factor have errors.

The power calibration measurement of this example is a simple measurement process, the time required for measurement is shortened, and a number of samples can be measured within a short time. Hence, this method is suitable for an inspection system of a manufacturing line, which must automatically measure a number of samples.

As described above, according to the measuring method of this embodiment, the output characteristics of a stacked photoelectric conversion device can be accurately measured. In addition, since an equivalent measurement accuracy can be obtained without using any expensive measuring apparatus, unlike the multi-source method, the cost can be reduced. Furthermore, although neither complex control nor strict selection of measurement conditions are required, unlike the multi-source method or standard sunlight method, an equivalent measurement accuracy can be obtained, and the measurement can be facilitated.

When, of individual semiconductor junctions of a stacked photoelectric conversion device, a semiconductor junction for limiting the short-circuit current of the stacked photoelectric conversion device in light irradiation is defined as a current-limiting cell, the degree of approximation for spectral response between the stacked photoelectric conversion device to be tested and a stacked photoelectric conversion device as a reference improves because the current-limiting cells are formed from the same semiconductor junction between test and reference devices, error in short-circuit current and fill factor is reduced, and the measurement accuracy for the output characteristics of the stacked photoelectric conversion device can be improved.

As many apparently widely different embodiments of the present invention can be made without departing from the spirit and scope thereof, it is to be understood that the invention is not limited to the specific embodiments thereof except as defined in the appended claims.

What is claimed is:

1. A method of measuring photoelectric conversion characteristics of a test device to be tested by varying voltage to be applied to the device and measuring a current vs. voltage characteristic of the device, said method comprising the steps of:
   obtaining a current vs. voltage characteristic of a reference device having a similar construction to that of the test device, in standard test conditions;
   measuring current vs. voltage characteristics of the test and reference devices in light irradiation, in test conditions different from the standard test conditions; and
   calculating photoelectric conversion characteristics of the test device in accordance with the measured current vs. voltage characteristics of the test and reference devices, and the current vs. voltage characteristic of the reference device obtained in the standard test conditions.

2. The method according to claim 1, wherein a measurement result of the current vs. voltage characteristic of the test device is corrected on the basis of a ratio of a measurement result of a short-circuit current of the reference device to a short-circuit current thereof in the standard test conditions and a ratio of a measurement result of a fill factor of the reference device to a fill factor thereof in the standard test conditions, thereby calculating the photoelectric conversion characteristics of the test device.

3. The method according to claim 1, wherein a measurement result of the current vs. voltage characteristic of the test device is corrected on the basis of a ratio of a measurement result of a short-circuit current of the reference device to a short-circuit current thereof in the standard test conditions and a ratio of a measurement result of a maximum power of the reference device to a maximum power thereof in the standard test conditions, thereby calculating the photoelectric conversion characteristics of the test device.

4. The method according to claim 1, further comprising the step of adjusting an irradiance of pseudo sunlight used for light irradiation such that a maximum power of the reference device substantially equals a maximum power of the reference device in the standard test conditions.

5. The method according to claim 1, wherein the test device is a photoelectric conversion device having a plurality of stacked semiconductor junctions.

6. The method according to claim 5, wherein, of the plurality of stacked semiconductor junctions, at least a current-limiting cell for limiting a short-circuit current of the test device in light irradiation is formed from the same semiconductor junction as that of a current-limiting cell of the reference device.

7. The method according to claim 1, wherein the reference device is a stacked photoelectric conversion device.

8. A measuring apparatus for measuring photoelectric conversion characteristics of a test device to be tested by measuring a current vs. voltage characteristic of the test device in light irradiation, said apparatus comprising:
   a voltage controller, arranged to control a voltage applied to a device;
   a detector, arranged to detect a voltage and a current of the device; and
   a calculator arranged to calculate the photoelectric conversion characteristics of the test device in accordance with measured current vs. voltage characteristics of the test device and a reference device having a similar construction to that of the test device in test conditions, and a current vs. voltage characteristic, which has been measured in advance, of the reference device in standard test conditions different from the test conditions.

9. The apparatus according to claim 8, wherein said calculator corrects a measurement result of the current vs. voltage characteristic of the test device on the basis of a ratio of a measurement result of a short-circuit current of the reference device to a short-circuit current thereof in the standard test conditions and a ratio of a measurement result of a fill factor of the reference device to a fill factor thereof in the standard test conditions, thereby calculating the photoelectric conversion characteristics of the test device.

10. The apparatus according to claim 8, wherein said calculator corrects a measurement result of the current vs. voltage characteristic of the test device on the basis of a ratio of a measurement result of a short-circuit current of the reference device to a short-circuit current thereof in the standard test conditions and a ratio of a measurement result of a maximum power of the reference device to a maximum power thereof in the standard test conditions, thereby calculating the photoelectric conversion characteristics of the test device.

11. The apparatus according to claim 8, further comprising pseudo sunlight used for light irradiation, wherein an irradiance of the pseudo sunlight is adjusted such that a maximum power of the reference device substantially equals a maximum power of the reference device in the standard test conditions.

12. The apparatus according to claim 8, wherein the test device is a stacked photoelectric conversion device.

13. The apparatus according to claim 8, wherein the reference device is a stacked photoelectric conversion device.

14. A computer program product storing a computer readable medium comprising a computer program code, for a measuring method of measuring photoelectric conversion characteristics of a test device to be tested by varying voltage to be applied to the device and measuring a current vs. voltage characteristic of the device, said method comprising the steps of:

obtaining a current vs. voltage characteristic of a reference device having a similar construction to that of the test device, in standard test conditions;

measuring current vs. voltage characteristics of the test and reference devices in light irradiation, in test conditions different from the standard test conditions; and calculating photoelectric conversion characteristics of the test device in accordance with the measured current vs. voltage characteristics of the test and reference devices, and the current vs. voltage characteristic of the reference device obtained in the standard test conditions.

15. The product according to claim 14, wherein, in said calculating step, a measurement result of the current vs. voltage characteristic of the test device is corrected on the basis of a ratio of a measurement result of a short-circuit current of the reference device to a short-circuit current thereof in the standard test conditions and a ratio of a measurement result of a fill factor of the reference device to a fill factor thereof in the standard test conditions, thereby calculating the photoelectric conversion characteristics of the test device.

16. The product according to claim 14, wherein, in said calculating step, a measurement result of the current vs. voltage characteristic of the test device is corrected on the basis of a ratio of a measurement result of a short-circuit current of the reference device to a short-circuit current thereof in the standard test conditions and a ratio of a measurement result of a maximum power of the reference device to a maximum power thereof in the standard test conditions, thereby calculating the photoelectric conversion characteristics of the test device.

17. The product according to claim 14, further comprising a step of adjusting an irradiance of pseudo sunlight used for light irradiation such that a maximum power of the reference device substantially equals a maximum power of the reference device in the standard test conditions.

* * * * *